United States Patent [19]
Becker et al.

[11] Patent Number: 5,929,628
[45] Date of Patent: Jul. 27, 1999

[54] APPARATUS AND METHOD FOR PERFORMING AMPLITUDE CALIBRATION IN AN ELECTRONIC CIRCUIT TESTER

[75] Inventors: James H. Becker, Boston; Kenneth F. Coop, Walpole, both of Mass.

[73] Assignee: Teradyne, Inc., Boston, Mass.

[21] Appl. No.: 08/760,537

[22] Filed: Dec. 5, 1996

[51] Int. Cl.⁶ .................................................. G01R 31/28
[52] U.S. Cl. ..................................... 324/158.1; 324/73.1
[58] Field of Search .............................. 324/158.1, 73.1, 324/765; 371/22.1, 22.3; 702/106

[56] References Cited

U.S. PATENT DOCUMENTS

| | | | |
|---|---|---|---|
| 4,703,448 | 10/1987 | Muething, Jr. | 364/481 |
| 5,184,062 | 2/1993 | Ladwig | 324/74 |
| 5,548,538 | 8/1996 | Grace et al. | 364/571.04 |
| 5,572,160 | 11/1996 | Wadell | 327/427 |
| 5,604,751 | 2/1997 | Panis | 371/22.1 |
| 5,673,272 | 9/1997 | Proskauer et al. | 324/73.1 |

FOREIGN PATENT DOCUMENTS

| | | | |
|---|---|---|---|
| 0149095 A2 | 12/1984 | European Pat. Off. | 27/28 |
| 0242700 A2 | 4/1987 | European Pat. Off. | |
| 0563676 A2 | 3/1993 | European Pat. Off. | |
| 0699914 A1 | 3/1996 | European Pat. Off. | 31/133 |
| 0715177 A2 | 6/1996 | European Pat. Off. | 31/316 |

*Primary Examiner*—Vinh P. Nguyen
*Attorney, Agent, or Firm*—Richard E. Gamache

[57] ABSTRACT

An electronic circuit tester, having an amplitude calibration feature, for accurately measuring signals produced by an electronic device under test, including a plurality of channels, data acquisition circuitry, an internal calibration source, and a digital filter. The internal calibration source is calibrated to a known standard. The tester then uses the internal calibration source to measure a signal amplitude error introduced by the channels and data acquisition circuitry. Next, the digital filter is automatically adjusted to correct the signal amplitude error, thereby presenting corrected data samples to a test computer for subsequent analysis.

13 Claims, 7 Drawing Sheets

APPARATUS AND METHOD FOR PERFORMING AMPLITUDE CALIBRATION IN AN ELECTRONIC CIRCUIT TESTER

BACKGROUND OF INVENTION

This invention relates generally to automatic test equipment, and more particularly to automatic test equipment, having an amplitude calibration feature, for accurately measuring signals produced by an electronic device under test.

Automatic test equipment, also known as a tester, is commonly used in the manufacture of semiconductor devices to determine whether the devices contain manufacturing defects. In this way, defective devices can be identified before being incorporated into an electronic product, thereby minimizing the chance that the electronic product will fail prematurely in the field.

Semiconductor devices that process both analog and digital signals must be tested with testers that are capable of producing and receiving both analog and digital signals. Such devices are commonly called mixed-signal devices, and the testers that test these devices are known as mixed-signal testers.

A tester generally includes computerized control circuitry (test computer), data acquisition circuitry (capture instruments), driver/receiver channels (channels), and tester pins. Each tester pin connects a channel to an electrical node of a device under test (DUT). Further, each channel is coupled to a capture instrument that collects data for subsequent analysis by the test computer.

A tester generally operates by executing test programs. A typical test program includes numerous test functions that direct the tester to perform various operations such as setting-up the tester, applying a test signal to a node of the DUT, measuring an output signal at another node of the DUT, moving data from the local memory of the capture instrument to the main memory of the test computer, analyzing the data, comparing analysis results to specified limits, and organizing the analysis results for subsequent printout or display.

FIG. 1A shows a block diagram of prior art mixed-signal tester 100. A test engineer typically develops a test program on computer work station 104, and then loads the test program into main memory 136 of test computer 102 using system bus 144.

During execution of the test program, test computer 102 sends control signals to driver/receiver channels 108, 110, 112, and 114, and capture instruments 116, 118, 120, and 122 through test computer interface 106. In a typical mode of operation, the control signals direct driver/receiver channel 108 to receive an output signal produced by DUT 132 through tester pin 124, and send the output signal to capture instrument 116 using line 150. The control signals then typically direct capture instrument 116 to filter the output signal using anti-aliasing filter 155, and sample the output signal using sample-and-hold 138. The control signals might also direct capture instrument 116 to convert the sampled data to digital form (if necessary) using a-to-d converter 140, and store the resulting digital data in local memory 142.

Additionally, the test program may direct test computer 102 to move the digital data from local memory 142 to main memory 136 so that processor 134 can analyze the data using digital signal processing (DSP) techniques. Accordingly, test computer interface 106 receives the digital data from local memory 142 through internal bus 148, and presents the digital data to main memory 136 using internal bus 146.

Although mixed-signal tester 100 may be used to analyze data derived from an output signal generated by DUT 132, we have recognized that the signal processing technique used by tester 100 yields testers which often do not have the desired performance. For example, before being sampled by sample-and-hold 138, the output signal produced by DUT 132 typically passes through either an attenuation stage (not shown) or an amplification stage (not shown) in driver/receiver channel 108.

However, both the attenuation stage and the amplification stage can introduce error into output signals produced by DUT 132. In particular, they can introduce signal amplitude error into the output signals, thereby causing processor 134 to produce analysis results that do not have the required level of accuracy.

Further, it is known in the field of signal analysis that a signal having a bandwidth equal to B Hz is uniquely represented by a group of samples taken every ½ B seconds. For this reason, the output signal produced by DUT 132 is first presented to anti-aliasing filter 155 in capture instrument 116. Anti-aliasing filter 155 is a low-pass filter stage designed to eliminate any signal components occurring at frequencies greater than B Hz. However, anti-aliasing filter 155 can also be a source of signal amplitude error. In particular, anti-aliasing filters are often insufficiently flat in the passband.

Finally, in order to obtain a group of samples taken every ½ B seconds, sample-and-hold 138 samples the output signal using a sampling rate that is greater than or equal to 2 B Hz. Sample-and-hold 138 then presents the sampled data to a-to-d converter 140. However, both sample-and-hold 138 and a-to-d converter 140 can also be sources of signal amplitude error.

FIG. 1B shows calibration circuit 156, described in U.S. patent application Ser. No. 08/347,633, filed Dec. 1, 1994, assigned to the same assignee as the present invention, the disclosure of which is expressly incorporated herein by reference. Calibration circuit 156, typically located in the channel circuitry of a tester, is used to correct all sources of amplitude error in a signal path to a device under test. Further, calibration circuit 156 is meant to be used in a mixed-signal tester that is capable of producing and receiving analog signals having frequencies within the radio frequency (RF) range.

In order to correct the error sources in a signal path to a device under test, switch 160 is actuated to connect terminal 158 to terminal 162, which is as close as possible to the end of the signal path. Next, an external reference standard (not shown) is connected to terminal 162, and calibration measurements are performed by the tester. The external reference standard includes a series of fixed reference standards.

Switch 160 is then actuated to connect terminal 158 to cal ref 164, which is an internal reference standard. Cal ref 164 also includes a series of fixed reference standards. Once again, the tester performs calibration measurements, and then compares them with the measurements made using the external reference standard. The difference between the calibration measurements made using the external and internal reference standards is proportional to the error introduced in the signal path. The test engineer then programs the tester to correct the error.

Although calibration circuit 156 may be used to correct signal amplitude error contributed by circuit elements in a signal path of a tester, we have recognized that the correction technique used by calibration circuit 156 also yields testers that may not have the desired performance. For example, correcting the error introduced in a signal path by adjusting each measurement by a predetermined amount substantially increases test time. Further, the calculated difference between measurements made with the external and internal reference standards may also include some error.

Accordingly, it would be desirable to have a tester that can automatically correct signal amplitude error, across an entire frequency spectrum of interest, without substantially increasing test time. It would also be desirable to have a tester that has an internal calibration source that is traceable to a known standard.

SUMMARY OF THE INVENTION

With the foregoing background in mind, it is an object of the invention to provide a tester that can automatically correct signal amplitude error introduced in its channel and data acquisition circuitry.

Another object of the invention is to provide a tester that can automatically correct signal amplitude error across any frequency spectrum.

Still another object of the invention is to provide a tester that has an adjustable, highly accurate, and repeatable internal calibration source.

The foregoing and other objects are achieved in a tester having an internal calibration source switchably connected to a plurality of channels, and a digital correction circuit switchably connected between a plurality of capture instruments and a test computer.

In one embodiment, each channel has an input connected to a means for selecting between an output of the internal calibration source and a tester pin. Also, each capture instrument has an output connected to a means for selecting between an input to a test computer and an input to the digital correction circuit.

According to one feature, the internal calibration source includes a high frequency, high precision current switch.

According to another feature, the digital correction circuit includes a finite impulse response (FIR) filter.

According to still another feature, the digital correction circuit includes an FIR filter coupled in series with an infinite impulse response (IIR) filter.

In another embodiment, the tester calibrates the internal calibration source by measuring the amplitude of a first signal having both a predetermined amplitude and a predetermined frequency. The tester then measures the amplitude of a second signal produced by the internal calibration source and having the same frequency as the first signal. Next, the tester repetitively adjusts a bias input of the internal calibration source and repetitively measures the amplitude of the second signal until the amplitude of the second signal equals the amplitude of the first signal. The tester then stores the level of the bias input, and the values of both the predetermined amplitude and the predetermined frequency. The steps of measuring the amplitude of the second signal, adjusting the bias input of the internal calibration source, and storing the level of the bias input and the values of both the predetermined amplitude and the predetermined frequency, are repeated for additional predetermined frequencies. Further, this embodiment is optionally repeated for additional predetermined amplitudes of the first signal.

In still another embodiment, the tester measures the amplitude response of its channel and data acquisition circuitry by applying a stored bias input level, corresponding to both a stored amplitude and frequency, to the internal calibration source, and measuring the amplitude of a signal produced by the internal calibration source. The steps of applying the stored bias input level, and measuring the amplitude of the signal produced by the internal calibration source, are repeated for additional stored frequencies. Further, this embodiment is optionally repeated for additional stored amplitudes. Finally, the tester calculates the frequency response of the data acquisition channel using the amplitude measurements of the signal produced by the internal calibration source, thereby determining the signal amplitude error contributed by its channel and data acquisition circuitry.

In yet another embodiment, the tester corrects the signal amplitude error contributed by its channel and data acquisition circuitry by filtering a measured signal. The frequency response of the filter in the preferred embodiment is such that when the filter is coupled to the channel and data acquisition circuitry, the overall frequency response of the channel circuitry, the data acquisition circuitry, and the filter is flat in the passband.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1A:
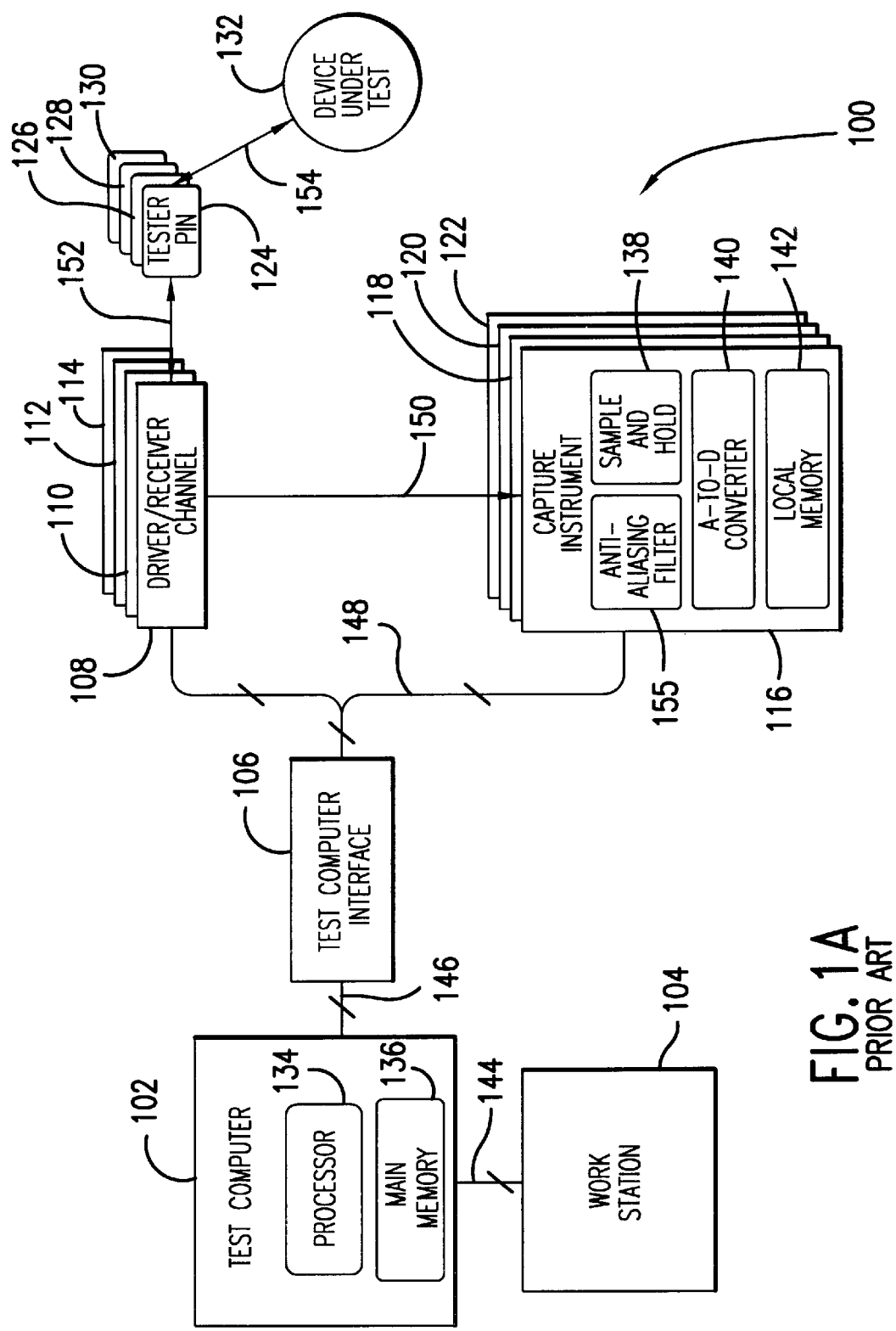
FIG. 1A is a block diagram of a prior art mixed-signal tester that is capable of analyzing data derived from a signal produced by a DUT.
Figure 1B:
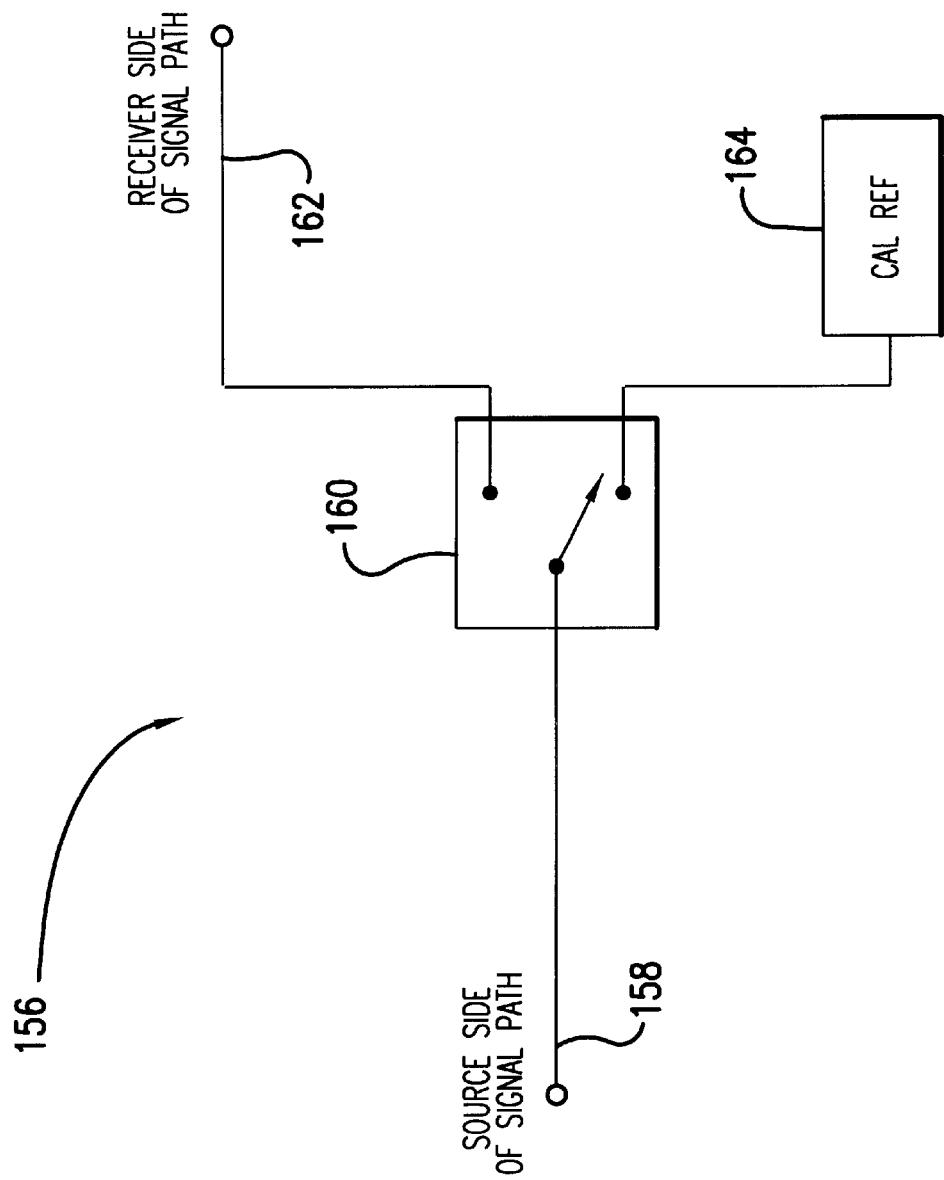
FIG. 1B is a block diagram of a prior art calibration circuit that corrects signal amplitude error introduced by the channel and data acquisition circuitry of a mixed-signal tester.
Figure 2A:
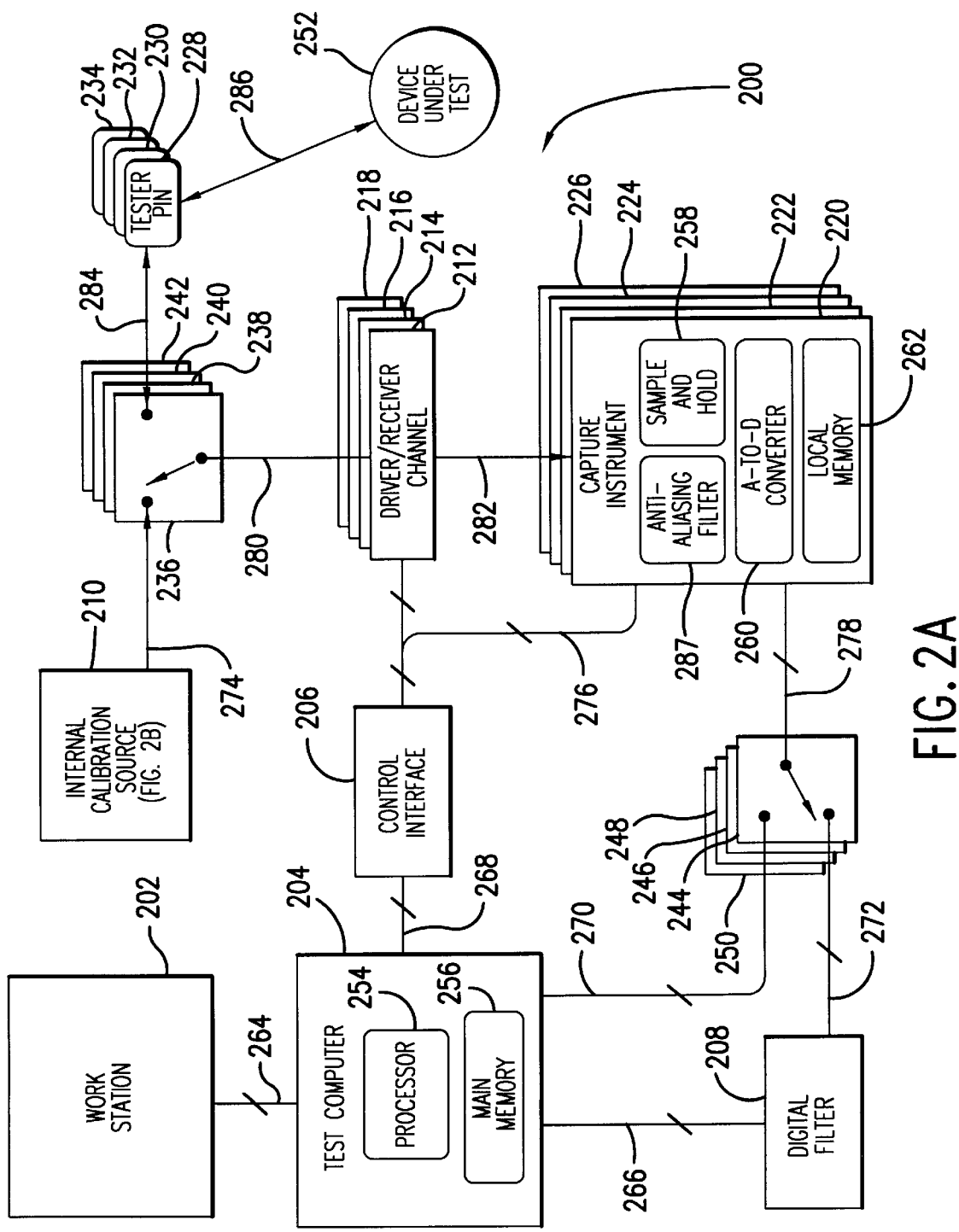
FIG. 2A is a block diagram of a mixed-signal tester configured according to the present invention.

FIG. 2A shows an embodiment of a mixed-signal tester that is capable of analyzing data derived from output signals produced by an electronic circuit. A test engineer typically develops test programs for tester 200 on work station 202, and loads the test programs into main memory 256 of test computer 204 using system bus 264. The test engineer also typically enters commands for tester 200 at work station 202. For example, the test engineer may enter commands to specify certain operating parameters, and to start a test sequence. At the end of the test sequence, tester 200 sends test results to work station 202 using system bus 264 for subsequent printout or display.

A device under test generally includes more than fifty, and likely more than one hundred pins. For this reason, tester 200 generally includes more than one hundred tester pins. In particular, tester pins 228, 230, 232, and 234 are each connected to different pins (not shown) on DUT 252. Further, switches 236, 238, 240, and 242 can be actuated to connect channels 212, 214, 216, and 218 to tester pins 228, 230, 232, and 234.

In a typical test sequence, a channel applies a test signal to a pin (not shown) of DUT 252 through a tester pin, and another channel detects an output signal at another pin (not shown) of DUT 252 through another tester pin. The test program generally specifies the characteristics of both the test signals applied to DUT 252, and the output signals tester 200 expects to receive from DUT 252.

Internal bus 276 connects control interface 206 to channels 212, 214, 216, and 218, and capture instruments 220, 222, 224, and 226. Control interface 206 typically buffers control signals passing between test computer 204, and both the driver/receiver channels and the capture instruments. Further, internal bus 268 connects test computer 204 to control interface 206. Using internal buses 268 and 276, and control interface 206, test computer 204 sends both programming and control signals to the channels and the capture instruments.

In particular, test computer 204 may send commands through control interface 206 to both channel 212 and capture instrument 220 to program them for an upcoming test. For example, test computer 204 may program channel 212 to receive an output signal from DUT 252 through tester pin 228, and present the samples to capture instrument 220 using line 282. Also, test computer 204 may program capture instrument 220 to filter the output signal using anti-aliasing filter 287, and sample the filtered output signal using sample-and-hold 258. Also, test computer 204 may program capture instrument 220 to convert the samples from analog to digital form (if necessary) using a-to-d converter 260, and store the data samples in local memory 262.

Further, switches 244, 246, 248, and 250 can be actuated to connect capture instruments 220, 222, 224, and 226 directly to test computer 204. In particular, switch 244 can be actuated to connect data bus 270 to data bus 278 so that data samples can be moved from local memory 262 to main memory 256 for subsequent analysis by processor 254.

It is known that the channel and data acquisition circuitry of a tester can contribute to signal amplitude error in signals received from a device under test. Specifically, both the attenuation stages (not shown) and the amplification stages (not shown) commonly found in channel circuitry can introduce error into signals received from a device under test.

Also, capture instruments commonly include both anti-aliasing filters (e.g., anti-aliasing filter 287) and sample-and-hold devices (e.g., sample-and-hold 258), which prepare analog signals for conversion to digital form. However, both filter stages and sample-and-hold devices can introduce error into signals received from a device under test. Further, a-to-d converters (e.g., a-to-d converter 260) can also contribute to signal error.

An advantage of the present invention is that it gives a tester the ability to measure the signal amplitude error introduced into a signal by its channel and data acquisition circuitry, and then correct the measured signal amplitude error. This advantage is realized through the use of internal calibration source 210, and digital filter 208.

During a typical calibration sequence, switch 236 is actuated to connect channel 212 to internal calibration source 210. In the preferred embodiment, internal calibration source 210 is a high precision current switch. Control signals (not shown) can be applied to internal calibration source 210 manually by the test engineer, thereby causing internal calibration source 210 to produce a calibration signal having a particular amplitude and frequency. In the preferred embodiment, the control signals are applied to internal calibration source 210 automatically through the test program. The calibration signal can then be made to pass directly to channel 212 through switch 236.

Further, switch 244 is actuated to connect capture instrument 220 to either test computer 204 or digital filter 208. In the preferred embodiment, digital filter 208 is a finite impulse response (FIR) filter having 32 taps, and 12-bit resolution. A digital filter having the required performance is the PDSP16256/A, manufactured by Plessey.

Digital filter 208 also preferably has a real-time throughput of 12.5 MHz. This is because data buses 266, 270, 272, and 278 also have a throughput of 12.5 MHz in the preferred embodiment. A benefit of the present invention is that the processing of sampled data by digital filter 208 can occur without substantially increasing the time required to move the data from local memory 262 to main memory 256. As a result, the present invention can correct signal amplitude error without increasing the time required to perform a test. Keeping testing time to a minimum is very important for testers. In order to achieve the required throughput rate of 12.5 MHz, digital filter 208 might be implemented using a multi-rate filter bank, which consists multiple FIR filters coupled in parallel.

Tester 200 measures the signal amplitude error by determining the amplitude response of its channel and data acquisition circuitry, and then corrects the measured error by first calculating a set of filter coefficients for digital filter 208, and then loading the filter coefficients into the local memory (not shown) of digital filter 208. Switch 244 is then actuated to connect digital filter 208 to capture instrument 220, thereby allowing digital filter 208 to present corrected data samples to main memory 256 for subsequent processing by processor 254.

Figure 2B:
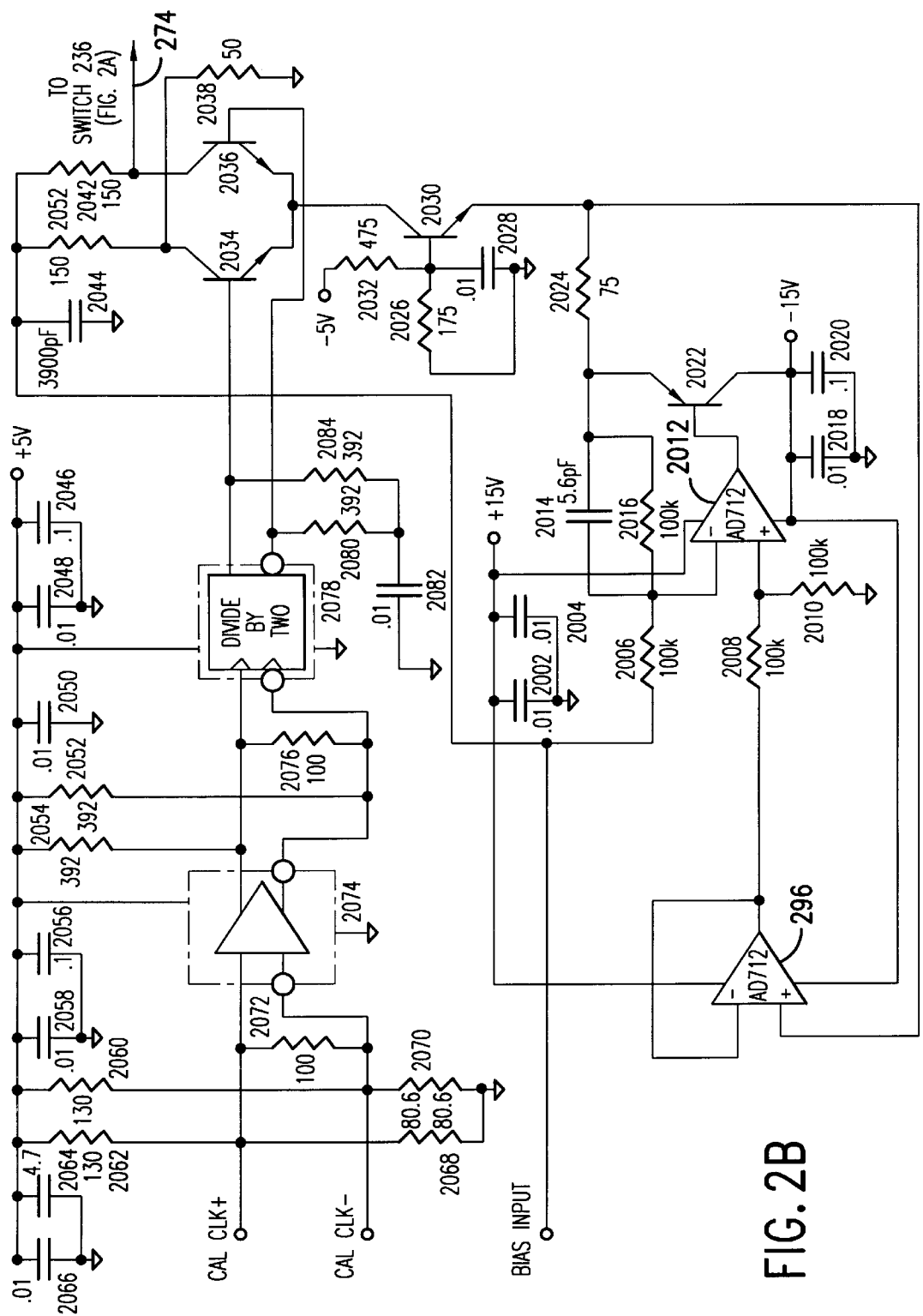
FIG. 2B is a detailed block diagram of the internal calibration source shown in FIG. 2A.

Turning now to FIG. 2B, the structure of internal calibration source 210 is shown in greater detail. A high precision current switch, including a balanced differential transistor pair comprised of transistors 2034 and 2036, and a current source, including precision op amp 2012 and transistor 2022, are known to persons skilled in the art. Control signal BIAS INPUT, which is applied to the current switch either manually by the test engineer or preferably automatically through the test program, determines the amplitude of the signal produced by internal calibration source 210 on line 274. In the preferred embodiment, internal calibration source 210 can be adjusted to produce signals that span the full input voltage range of the channel and data acquisition circuitry of tester 200.

Further, differential clocks CAL CLK+ and CAL CLK−, which are also applied to the current switch either directly by the test engineer or preferably through program control, determine the frequency of the signal appearing on line 274. In the preferred embodiment, the frequency of differential clocks CAL CLK+ and CAL CLK− is such that the frequency of the signal produced by internal calibration source 210 and the frequency of the sampling clock (not shown) applied to sample-and-hold 258 satisfy an M/N relationship. It is known that such a relationship can be used to avoid "smearing" of results, which often occurs when data samples undergo digital signal processing (for example, fast fourier transform, or FFT, analysis).

A benefit of internal calibration source 210, as depicted in FIG. 2B, is that it produces a calibration signal that does not drift over time and temperature. This means that the calibration signal has good repeatability. Although components in the channel and data acquisition circuitry may drift over time and temperature, tester 200 can use the known calibration signal generated by internal calibration source 210 to measure the signal amplitude error automatically, and then correct the signal amplitude error by adjusting digital filter 208. The signal amplitude error is preferably measured and corrected just before a test, and then at regular intervals.

Another benefit is that the test engineer can adjust internal calibration source 210 so that it produces a signal equal to a level generated by an external calibration source. The external calibration source is preferably traceable to a known standard. As a result, it is not necessary to connect the external calibration source to the tester each time the test engineer wishes to measure the signal amplitude error introduced by the channel and data acquisition circuitry. Instead, the test engineer can calibrate internal calibration source 210 using the external calibration source, and then use internal calibration source 210 to perform subsequent signal amplitude error measurements.

Earlier solutions for correcting signal amplitude error in the field included calculating adjustments to measurements made using an internal calibration standard. In contrast, the present invention gives the test engineer the ability to adjust a level produced by internal calibration source 210. As a result, the calculation of adjustments to calibration measurements is no longer necessary.

Figure 3:
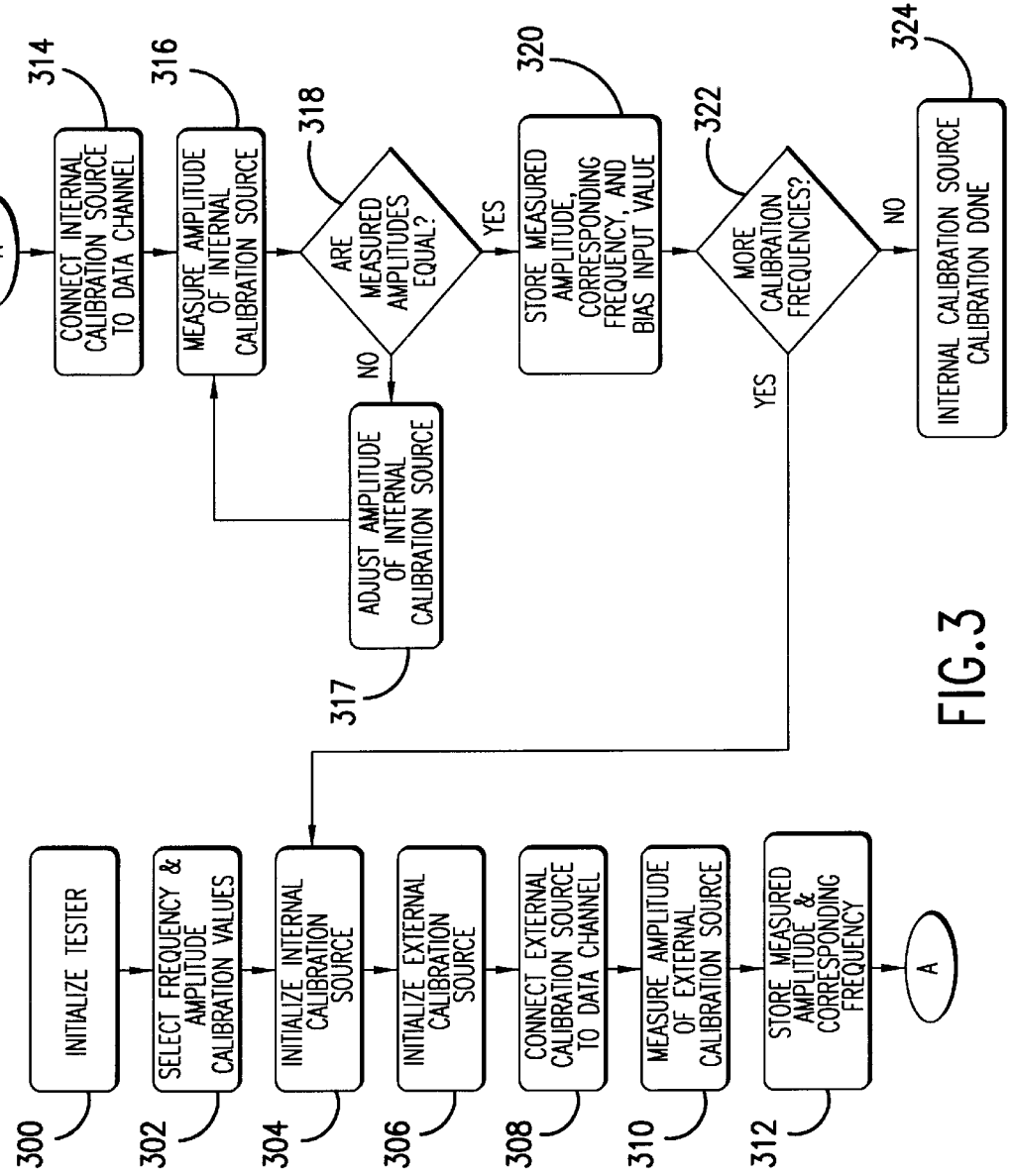
FIG. 3 is a flowchart depicting the calibration of the internal calibration source according to the present invention.

In the preferred embodiment, the test engineer calibrates internal calibration source 210 in accordance with the procedure shown in FIG. 3. First, tester 200 is initialized in block 300. In a typical initialization sequence, the test engineer selects the front-end circuitry to be used, the gain range, both the data sample size and the sampling rate, and the input termination. The test engineer typically selects either a differential (AC or DC) or a single-ended front end. Further, the gain range typically spans from 8 millivolts to 2 volts, the sampling rate is typically within the range of 620 kHz to 100 MHz, and the input termination is typically either 50 Ω to ground or 10 kΩ to ground on each input. The test engineer also determines the characteristics of anti-aliasing filter 287 and a-to-d converter 260 in block 300.

It is important to note that the initializing in block 300 might change the input impedance of the channel and data acquisition circuitry, thereby introducing signal amplitude error in both the calibration signals produced by internal calibration source 210 and the signals generated by DUT 252. For this reason, the test engineer should calibrate internal calibration source 210 whenever tester 200 is initialized with a different set-up configuration. In this way, tester 200 will achieve the highest level of measurement accuracy.

In block 302, the test engineer selects both a calibration frequency value and a calibration amplitude value. The calibration frequency value is generally selected to be within the range of signal frequencies that tester 200 expects to receive from DUT 252. Also, the selected calibration amplitude value is generally within the input voltage range of the channel and data acquisition circuitry of tester 200.

Next, the test engineer initializes internal calibration source 210 in block 304. Signals CLK+ and CLK− are chosen so that internal calibration source 210 produces a signal having a frequency that is equal to the calibration frequency value selected in block 302. Further, signal BIAS INPUT is chosen so that the signal generated by internal calibration source 210 has a nominal amplitude. Later in the internal calibration source calibration procedure, signal BIAS INPUT will be adjusted until the amplitude of the signal produced by internal calibration source 210 equals the calibration amplitude value selected in block 302.

The test engineer also initializes an external calibration source in block 306. The external calibration source is adjusted so that it produces a signal having both the frequency and amplitude values selected in block 302. To ensure the most accurate calibration of internal calibration source 210, the external calibration source preferably produces signal levels that are traceable to a known standard.

The test engineer then connects the external calibration source to a tester pin of tester 200 in block 308. This step includes actuating a switch, such as switch 236, 238, 240 or 242, to connect the tester pin to a channel, such as channel 212, 214, 216, or 218.

Tester 200 then measures the amplitude of the signal produced by the external calibration source in block 310. The measuring of the signal produced by the external calibration source includes filtering by anti-aliasing filter 287, sampling by sample-and-hold 258, converting from analog to digital form by a-to-d converter 260, and digital signal processing of data samples by processor 254. The measured amplitude, along with the corresponding selected frequency value, are then stored in main memory 256 in block 312.

As mentioned above, the external calibration source is adjusted to produce a signal having selected frequency and amplitude values in block 306. However, when tester 200 measures this signal in block 310, tester 200 might obtain an amplitude value that is different from the selected amplitude value. This is because the channel and data acquisition circuitry could introduce signal amplitude error. Nevertheless, the purpose of the procedure for calibrating internal calibration source 210 is to make internal calibration source 210 look like the external calibration source. Even though the amplitude measured by tester 200 might be slightly different from the selected amplitude, the test engineer can subsequently use the measured amplitude to make internal calibration source 210 produce the same amplitude level as the external calibration source.

In block 314, tester 200 connects internal calibration source 210 to the same channel that was connected to the external calibration source in block 308. This step includes actuating a switch, such as switch 236, 238, 240 or 242, to connect the channel to internal calibration source 210.

Tester 200 then measures the amplitude of the signal produced by internal calibration source 210 in block 316. The measurement occurring in block 316 includes the same steps as the measurement that took place in block 310.

However, if the amplitude measured in block 316 does not equal the amplitude measured in block 310, then decision block 318 causes the procedure to loop first to block 317 and then back to block 316. In block 317, signal BIAS INPUT is adjusted to either increase or decrease the signal amplitude, as required. The measuring in block 316 and the adjusting in block 317 is repeated until the signal amplitude produced by internal calibration source 210 equals the signal amplitude produced by the external calibration source. The BIAS INPUT level, along with both the corresponding selected frequency value and the measured amplitude, are then stored in main memory 256 in block 320.

Blocks 304, 306, 308, 310, 312, 314, 316, 317, 318, and 320 are generally repeated for other selected calibration frequency values. Decision block 322 causes the procedure to loop back to block 304. In the preferred embodiment, at least fifty frequency values are selected for each amplitude value, and corresponding BIAS INPUT values are determined for each frequency/amplitude pair. Tester 200 subsequently uses the frequency values, along with measured amplitude values, to determine the amplitude response of the channel and data acquisition circuitry.

Internal calibration source 210 is typically calibrated using the method shown in FIG. 3 on the factory floor before tester 200 is sent to the field. Further, the amount of time typically required to calibrate internal calibration source 210 using this method is ninety minutes.

Figure 4:
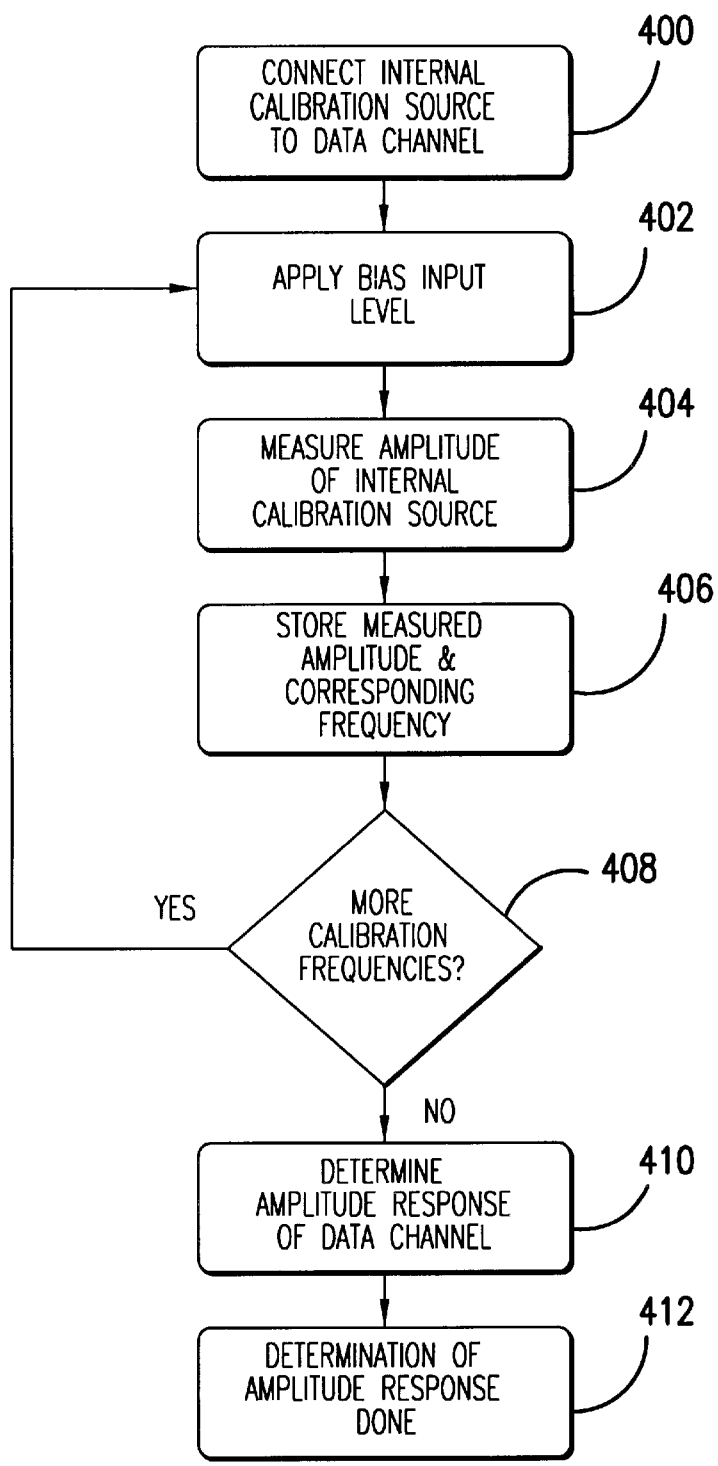
FIG. 4 is a flowchart depicting the measurement of the amplitude response of the channel and data acquisition circuitry according to the present invention.

Tester 200 preferably determines the amplitude response of the channel and data acquisition circuitry in accordance with the procedure shown in FIG. 4. First, tester 200 connects internal calibration source 210 to a channel, in particular channel 212, 214, 216, or 218 (FIG. 2A), in block 400. This step includes actuating a switch, such as switch 236, 238, 240, or 242, to couple the specified channel to internal calibration source 210.

Tester 200 then applies a stored BIAS INPUT level, corresponding to a selected frequency value, to internal calibration source 210 in block 402. This causes internal calibration source 210 to produce a signal having an amplitude that is equal to a known traceable standard, as long as internal calibration source 210 was first calibrated according to the procedure shown in FIG. 3.

Next, tester 200 measures the amplitude of the signal produced by internal calibration source 210 in block 404. Once again, the steps for measuring signal amplitude in block 404 are the same as the steps used in both block 310 and block 316. The measured amplitude value, along with the corresponding selected frequency value, are then stored in main memory 256 in block 406.

Blocks 402, 404, and 406 are generally repeated for other stored BIAS INPUT values and corresponding selected frequency values. Decision block 408 causes the procedure to loop back to block 402. At least fifty BIAS INPUT value/frequency value pairs are preferably used, and corresponding amplitudes are measured and stored for each pair.

Tester 200 then determines the amplitude response of the channel and data acquisition circuitry in block 410. Tester 200 typically uses processor 254 to calculate the amplitude gain at each selected frequency. The amplitude gain is determined using both the amplitude stored in block 320 and the amplitude stored in block 406. Tester 200 subsequently uses the amplitude response to correct the amplitude error introduced by the channel and data acquisition circuitry.

The amplitude response of the channel and data acquisition circuitry is typically determined using the method shown in FIG. 4 each time tester 200 is initialized with a new set-up configuration, and then at regular intervals. The amount of time typically required to determine the amplitude response following this method is sixty seconds.

Figure 5:
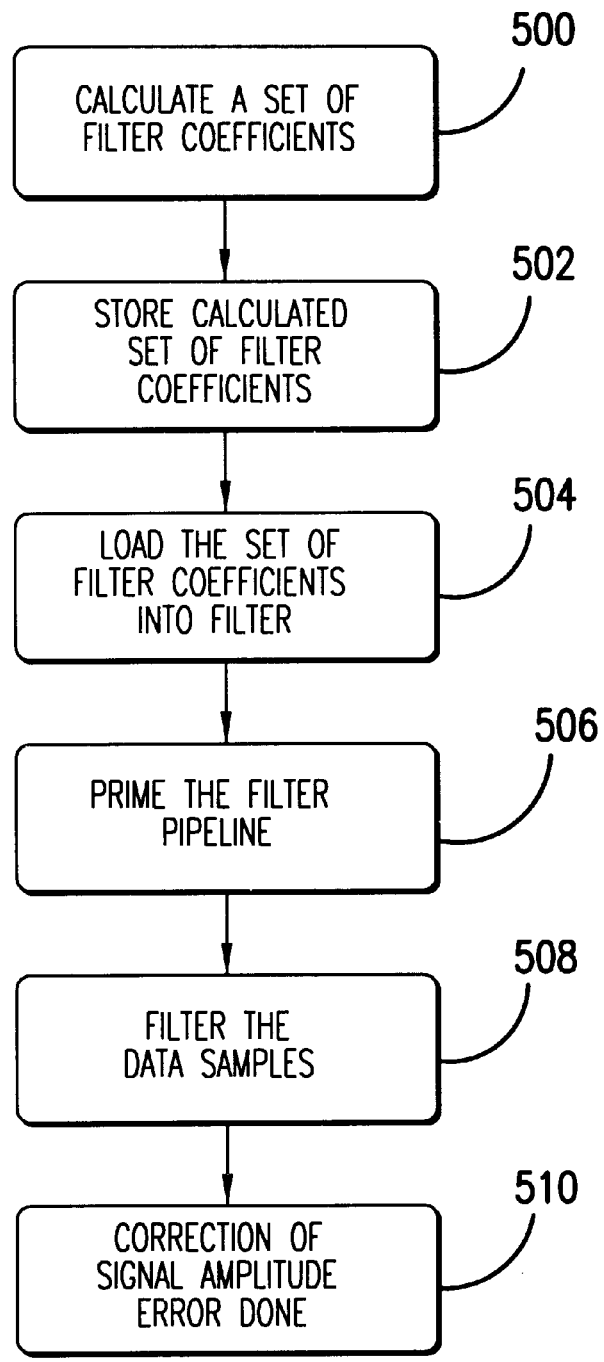
FIG. 5 is a flowchart depicting the correction of the channel and data acquisition circuitry according to the present invention.

In the preferred embodiment, tester 200 corrects the amplitude error introduced by the channel and data acquisition circuitry in accordance with the procedure shown in FIG. 5. First, tester 200 calculates a set of filter coefficients for digital filter 208 in block 500.

It is known that continuous-time signals that are transformed by a linear time-invariant system are sometimes distorted. Similarly, discrete-time signals that are transformed by linear shift-invariant signals can also become distorted. The channel and data acquisition circuitry of tester 200 typically includes sections comprising either linear time-invariant systems or linear shift-invariant systems.

It is also known that one way to recover a signal after it has been transformed and distorted by either a linear time-invariant system or a linear shift-invariant system is by "inverse filtering" the distorted signal. This means that a filter must be designed so that the overall impulse response of the filter and the transforming circuitry in cascade is a unit sample. Accordingly, the filter coefficients are calculated in block 500 such that the overall response of the channel/data acquisition circuitry and digital filter 208 in cascade is a unit sample.

As mentioned above, digital filter 208 is preferably an FIR filter having 32 taps and 12-bit resolution. Also, the filter coefficients might be calculated using the well known Parks-McClellan/Remez exchange algorithm. The amount of time typically required to calculate a set of 32 filter coefficients using this algorithm is 10 to 20 msecs. Block 500 is optionally repeated for each amplitude response determined using the method depicted in FIG. 4.

The set of filter coefficients calculated in block 500 is then stored in a local memory (not shown) of digital filter 208 in block 502. Multiple sets of filter coefficients, corresponding to different set-up configurations, might be calculated and stored in the local memory. As a result, a new set of coefficients can be quickly loaded into digital filter 208 when the set-up configuration of tester 200 changes.

Next, a suitable set of filter coefficients is loaded into digital filter 208 in block 504. A set of filter coefficients is typically loaded into digital filter 208 between the time when a set of data samples is captured, and the time when the data samples are moved to main memory 256. A new set of filter coefficients is also generally loaded into digital filter 208 when the set-up configuration of tester 200 changes. The amount of time required to move 32 filter coefficients from the local memory to digital filter 208 typically does not exceed 3 $\mu$secs.

It is known that after n filter coefficients are loaded into an FIR filter, n data samples must pass through the filter in order to prepare the filter for subsequent filtering. This operation is commonly known as "priming" the FIR filter pipeline. Accordingly, digital filter 208 is primed to received data samples in block 506. In the preferred embodiment, the priming operation consists of moving 32 data samples through digital filter 208 at a rate of 12.5 MHz. The amount of time required to prime digital filter 208 typically does not exceed 3 $\mu$secs.

Next, the data samples are filtered in block 508, thereby correcting the signal amplitude error introduced into the data samples by the channel and data acquisition circuitry. This step includes actuating a switch, such as switch 244, 246, 248, or 250, to connect the capture instrument to digital filter 208, which then presents the corrected data samples to test computer 204.

Having described one embodiment, numerous alternative embodiments or variations might be made. For example, it was shown in FIG. 2B that internal calibration source 210 consists of a high precision current switch, which includes a balanced differential transistor pair and a current source. However, this implementation is merely an illustration. For example, internal calibration source 210 can also be implemented by modifying an absolute level reference oscillator to produce an absolute level reference at any frequency within a specified bandwidth. Internal calibration source 210 may alternatively be implemented using either a noise diode or a comb generator.

Also, it was described that during the calibration of internal calibration source 210, a BIAS INPUT level, along with both a corresponding selected frequency value and a measured amplitude of internal calibration source 210, are stored in main memory 256. However, this implementation is also an illustration. Alternatively, the difference between a measured amplitude of an external calibration source and the measured amplitude of internal calibration source 210 might be calculated and stored.

Also, it was described that digital filter 208 is an FIR filter. However, this is also merely an illustration. For example, digital filter 208 can also be implemented using an infinite impulse response (IIR) filter. Further, a digital filter comprised of an FIR stage coupled to an IIR stage might be more appropriate for certain applications.

Also, it was described that at least fifty frequency values are used to determine the amplitude response of the channel and data acquisition circuitry across a selected frequency spectrum. However, this is merely an illustration. A different number of frequency points may be more appropriate for certain applications to achieve the most accurate test results.

Finally, it was described that digital filter 208 is an FIR filter having 32 taps and 12-bit resolution. However, this implementation is also merely an illustration. One of skill in the art may design a digital filter having different characteristics that yields the desired performance.

Therefore, the invention should be limited only by the spirit and scope of the appended claims.

What is claimed is:

1. An electronic circuit tester for determining whether a device under test is functioning properly, including a plurality of channels, each channel being connected to a respective data acquisition circuit, wherein the plurality of channels and the respective data acquisition circuits contribute a signal amplitude error to at least one signal produced by the device under test, comprising:
   (a) means for producing a plurality of reference signals, switchably connected to each channel, the plurality of reference signals being used to determine a first amplitude response of one of the plurality of channels and the respective data acquisition circuit connected thereto; and
   (b) means for correcting the signal amplitude error, having a second amplitude response and being switchably connected to the respective data acquisition circuit,
      wherein the second amplitude response is adjustable, and
      wherein the one of the plurality of channels, the respective data acquisition circuit, and the means for correcting contribute no signal amplitude error to the at least one signal produced by the device under test.

2. The electronic circuit tester as recited in claim 1, further comprising
   (c) means for determining an amplitude response of the channels and the respective data acquisition circuits, connected to each channel, the respective data acquisition circuits, and the means for correcting the signal amplitude error.

3. The electronic circuit tester as recited in claim 2,
   wherein the means for correcting the signal amplitude error comprises a digital filter, and
   wherein the means for determining an amplitude response comprises a test computer having at least one processor and a memory.

4. The electronic circuit tester as recited in claim 3, further comprising
   a first high speed data bus connected between the data acquisition circuitry and the digital filter, and
   a second high speed data bus connected between the digital filter and the test computer.

5. The electronic circuit tester as recited in claim 4,
   wherein the first high speed data bus, the digital filter, and the second high speed data bus each have the same real-time throughput rate.

6. The electronic circuit tester as recited in claim 1,
   wherein the plurality of reference signals have respective amplitudes and respective frequencies, and
   wherein each respective amplitude has a magnitude within an operating range of the channel and data acquisition circuitry.

7. The electronic circuit tester as recited in claim 6,
   wherein each channel samples the at least one signal produced by the device under test at a predetermined sampling frequency.

8. The electronic circuit tester as recited in claim 1,
   wherein the means for correcting the signal amplitude error comprises a digital filter.

9. The electronic circuit tester as recited in claim 8,
   wherein each channel, the data acquisition circuitry, and the digital filter in cascade is characterized by an impulse response, the impulse response being a unit sample.

10. An electronic circuit tester, including an amplitude calibration feature, for accurately measuring signals produced by a device under test, and for determining whether the device under test is functioning properly, comprising:
   (a) a plurality of test pins;
   (b) a plurality of channels switchably connected to the test pins, for driving selected test pins, and for receiving the signals appearing on other selected test pins;
   (c) each channel being connected to a respective data acquisition circuit, for sampling the signals to produce data samples, for converting the data samples from analog to digital form, and for storing the data samples;
   (d) a test computer connected to each channel and the respective data acquisition circuits, for controlling the plurality of channels and the respective data acquisition circuits, and for analyzing the data samples; and
   (e) an internal calibration source switchably connected to each channel, for producing a calibration signal, wherein the calibration signal is used to determine a signal amplitude error contributed by the plurality of channels and the respective data acquisition circuits.

11. The electronic circuit tester as recited in claim 10, further comprising
   a digital filter connected to the test computer and switchably connected to each respective data acquisition circuit, for presenting corrected data samples to the test computer for subsequent analysis.

12. The electronic circuit tester as recited in claim 10, further comprising
   a first high speed data bus switchably connected to the respective data acquisition circuitry, and connected to the digital filter, and
   a second high speed data bus connected between the digital filter and the test computer.

13. The electronic circuit tester as recited in claim 12,
   wherein the first high speed data bus, the digital filter, and the second high speed data bus each have the same real-time throughput rate.

* * * * *